(12) United States Patent
Burger et al.

(10) Patent No.: US 9,515,233 B2
(45) Date of Patent: Dec. 6, 2016

(54) WAVELENGTH-CONVERTING ELEMENT, OPTOELECTRONIC COMPONENT AND PRINTING STENCIL

(71) Applicant: OSRAM Opto Semiconductors GmbH, Regensburg (DE)

(72) Inventors: Markus Burger, Regensburg (DE); Markus Richter, Burglengenfeld (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/785,099

(22) PCT Filed: Apr. 14, 2014

(86) PCT No.: PCT/EP2014/057543
§ 371 (c)(1),
(2) Date: Oct. 16, 2015

(87) PCT Pub. No.: WO2014/173721
PCT Pub. Date: Oct. 30, 2014

(65) Prior Publication Data
US 2016/0079488 A1 Mar. 17, 2016

(30) Foreign Application Priority Data
Apr. 25, 2013 (DE) .......................... 10 2013 207 564

(51) Int. Cl.
*H01L 33/00* (2010.01)
*H01L 33/50* (2010.01)
*B41N 1/24* (2006.01)
*H01L 33/56* (2010.01)
*H01L 33/62* (2010.01)

(52) U.S. Cl.
CPC ............... *H01L 33/507* (2013.01); *B41N 1/24* (2013.01); *H01L 33/505* (2013.01); *H01L 33/56* (2013.01); *H01L 33/62* (2013.01); *H01L 2224/48463* (2013.01)

(58) Field of Classification Search
CPC ......... H01L 33/507; H01L 33/56; H01L 33/62
USPC ........................................................... 257/98
See application file for complete search history.

(56) References Cited

U.S. PATENT DOCUMENTS

| 2010/0149816 | A1 | 6/2010 | Higashi et al. |
| 2011/0309404 | A1 | 12/2011 | Lee |
| 2013/0337593 | A1 | 12/2013 | Gallmeier et al. |
| 2014/0145231 | A1 | 5/2014 | Ahlstedt |
| 2014/0339582 | A1 | 11/2014 | Matsumura et al. |

FOREIGN PATENT DOCUMENTS

| DE | 10 2010 022 561 A1 | 12/2011 |
| DE | 10 2010 043 378 A1 | 5/2012 |
| DE | 10 2011 013 369 A1 | 7/2012 |
| WO | 2010/103902 A1 | 9/2010 |
| WO | 2010/143114 A1 | 12/2010 |
| WO | 2012/152652 A1 | 11/2012 |
| WO | 2012/169289 A1 | 12/2012 |

*Primary Examiner* — Anthony Ho
(74) *Attorney, Agent, or Firm* — DLA Piper LLP (US)

(57) ABSTRACT

A wavelength-converting element having the shape of a small flat plate having a basic shape with an outer contour, wherein the wavelength-converting element includes a cut-out compared to the basic shape which is defined by a boundary edge, and at a conjunction of the boundary edge and the outer contour, an angle of less than 90° is enclosed.

15 Claims, 2 Drawing Sheets

WAVELENGTH-CONVERTING ELEMENT, OPTOELECTRONIC COMPONENT AND PRINTING STENCIL

TECHNICAL FIELD

This disclosure relates to a wavelength-converting element, an optoelectronic component comprising a wavelength-converting element and a printing stencil for manufacturing a wavelength-converting element.

This application claims priority of DE 10 2013 207 564.2, the disclosure of which is hereby incorporated by reference.

BACKGROUND

Optoelectronic components are known in which a luminous color is converted by a wavelength-converting element. The wavelength-converting elements of such optoelectronic components comprise a luminous substance configured to absorb electromagnetic radiation with a first wavelength and subsequently emit electromagnetic radiation with a second, typically larger wavelength. It is also possible to combine various luminous substances to emit electromagnetic radiation with differing wavelengths. For example, optoelectronic components comprising light emitting diode chips emitting in the blue spectral range are known in which blue light generated by the light emitting diode chip is converted into white light by a wavelength-converting element.

It is known to shape such wavelength-converting elements as small plates which may be arranged above light-emitting surfaces of optoelectronic semiconductor chips. In this context, the small plates are formed comprising cavities for electrical contact pads arranged at the surfaces. Thereby, however, parts of the light-emitting surface of the optoelectronic semiconductor chips may remain uncovered by the wavelength-converting element in the vicinity of the electrical contact pads. In those regions, light may be emitted the wavelength of which has not been converted. This negatively affects reproducibility of an emission characteristic and of a color locus of corresponding optoelectronic components.

It could therefore be helpful to provide a wavelength-converting element, an optoelectronic component, and a printing stencil to produce a wavelength-converting element.

SUMMARY

We provide a wavelength-converting element having the shape of a small flat plate having a basic shape with an outer contour, wherein the wavelength-converting element includes a cut-out compared to the basic shape which is defined by a boundary edge, and at a conjunction of the boundary edge and the outer contour, an angle of less than 90° is enclosed.

We further provide an optoelectronic component including an optoelectronic semiconductor chip, wherein a wavelength-converting element is arranged on an upper side of the optoelectronic semiconductor chip.

We yet further provide a printing stencil for manufacturing a wavelength-converting element, including an opening having a basic shape with an outer contour, wherein the opening includes a cut-out compared to the basic shape which is defined by a boundary edge, and at a conjunction of the boundary edge and the outer contour, an angle of less than 90° is enclosed.

We still further provide a screen including the printing stencil.

Figure 1:
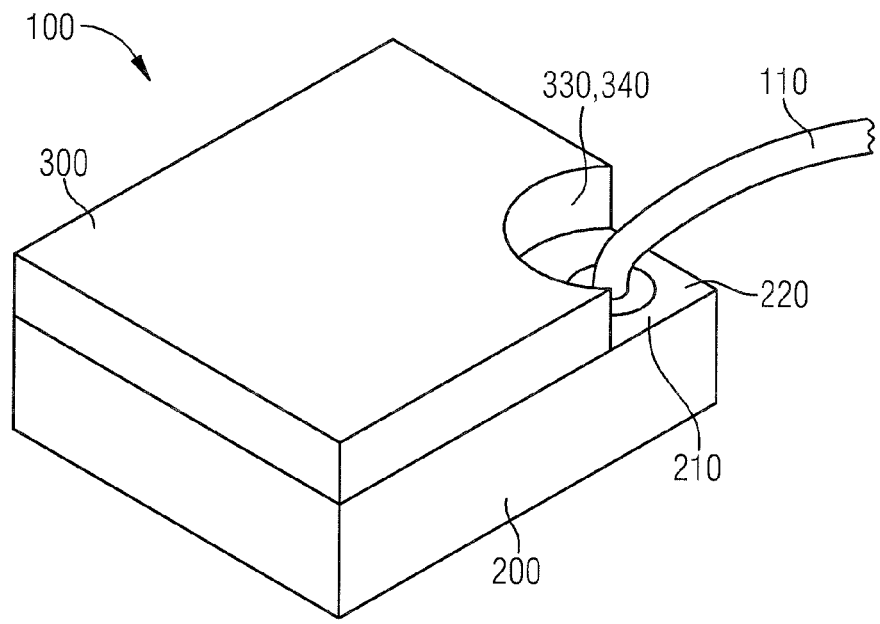
FIG. 1 shows a perspective view of an optoelectronic component having an optoelectronic semiconductor chip and a wavelength-converting element.

REFERENCE LIST 100 optoelectronic component
110 bond wire
200 optoelectronic semiconductor chip
210 upper side
220 bond pad
300 wavelength-converting element
310 basic shape
320 outer contour
321 first outer edge
322 second outer edge
323 third outer edge
324 fourth outer edge
330 corner region
340 cut-out
350 boundary edge
351 first intersection
352 second intersection
360 opening angle
361 first enclosed angle
362 second enclosed angle
400 printing stencil
405 opening
410 basic shape
420 outer contour
421 first outer edge
422 second outer edge
423 third outer edge
424 fourth outer edge
430 corner region
440 cut-out
450 boundary edge
451 first intersection
452 second intersection
460 opening angle
461 first enclosed angle
462 second enclosed angle
500 wavelength-converting element
510 basic shape
520 outer contour
521 first outer edge
522 second outer edge
523 third outer edge
524 fourth outer edge
540 cut-out
550 boundary edge
551 first intersection
552 second intersection
561 first enclosed angle
562 second enclosed angle

DETAILED DESCRIPTION

Our wavelength-converting element is formed as a flat small plate having a basic shape with an outer contour. Thereby, compared to the basic shape, the wavelength-converting element comprises a cut-out limited by a boundary edge. Whenever the boundary edge meets the outer contour, an angle of less than 90° is respectively enclosed. Advantageously, the cut-out of this wavelength-converting element is enclosed by the design of the boundary edge of the cut-out in a large angular area by the material of the wavelength-converting element. As a result, the wavelength-converting element completely covers a surface of an optoelectronic semiconductor chip on which the wavelength-converting element is arranged, even in the vicinity of the cut-out. Thus, the wavelength-converting element advantageously allows for a particularly complete wavelength conversion of an electromagnetic radiation emitted by an optoelectronic semiconductor chip.

The wavelength-converting element may have a rectangular basic shape. Advantageously, the wavelength-converting element is thus particularly suitable to be arranged on a rectangular optoelectronic semiconductor chip.

The cut-out may be arranged in a corner region of the basic shape of the wavelength-converting element. Advantageously, the wavelength-converting element is thus suitable to be arranged on an upper side of an optoelectronic semiconductor chip having an electrical contact pad arranged in a corner region.

The wavelength-converting element may comprise silicone. Advantageously, the wavelength-converting element may thus be produced particularly simply and inexpensively.

The wavelength-converting element may comprise an embedded phosphor. Thereby, the phosphor may be configured to absorb electromagnetic radiation of a first wavelength and subsequently emit electromagnetic radiation of a second, typically larger wavelength. Thereby, the phosphor embedded into the wavelength-converting element may advantageously cause a wavelength conversion of electromagnetic radiation.

Our optoelectronic component comprises an optoelectronic semiconductor chip on the upper side of which a wavelength-converting element of the above-mentioned type is arranged. Advantageously, the wavelength-converting element of this optoelectronic component very completely covers the surface of the optoelectronic semiconductor chip, the wavelength-converting element thus converting a very high percentage of the electromagnetic radiation emitted by the optoelectronic semiconductor chip. As a result, an undesired emission of an unconverted electromagnetic radiation may advantageously be avoided.

The optoelectronic semiconductor chip may be a light emitting diode chip (LED chip). The optoelectronic component then acts as a light-emitting-diode component. For example, the light-emitting-diode component may emit white light. The optoelectronic semiconductor chip of the optoelectronic component may in this context e.g. emit light having a wavelength in the blue spectral range. The wavelength-converting element of the optoelectronic component may convert light of a wavelength in the blue spectral range to white light. Thus, due to the particularly complete coverage of the surface of the optoelectronic semiconductor chip by the wavelength-converting element only a predetermined low or negligible percentage of unconverted light from the blue spectral range occurs at all positions of the optoelectronic component. As a result, the optoelectronic component may advantageously comprise a particularly homogeneous and reproducible emission characteristic and a color locus which may be determined particularly precisely.

A bond pad may be formed on the upper side of the optoelectronic semiconductor chip. Thereby, the cut-out of the wavelength-converting element is arranged above the bond pad. Advantageously, the bond pad electrically contacts the optoelectronic semiconductor chip of the optoelectronic component. The cut-out of the wavelength-converting element arranged on the upper side of the optoelectronic semiconductor chip electrically contacts the bond pad of the optoelectronic semiconductor chip by a bond wire.

A printing stencil to produce a wavelength-converting element comprises an opening having a basic shape with an outer contour. Thereby, compared to the basic shape, the opening comprises a cut-out limited by a boundary edge. Whenever the boundary edge meets the outer contour, an angle of less than 90° is respectively enclosed. Advantageously, the printing stencil produces wavelength-converting elements which may be arranged on upper sides of optoelectronic semiconductor chips and which particularly completely cover the upper sides even in the vicinity of the cut-out. Due to the design of the boundary edge of the cut-out of the opening of the printing stencil, it is guaranteed that a material of a wavelength-converting element produced by the printing stencil in a printing process closely limits the cut-out even in the area of a cut-out of the wavelength-converting element in spite of potential shape tolerances caused by the printing process.

The printing stencil may be shaped as a screen. Advantageously, the printing stencil is thus suitable for producing wavelength-converting elements by a screen-printing process.

The above-described properties, features and advantages as well as the manner in which they are achieved will become clearer in context with the following description of examples which will be explained in conjunction with the drawings.

FIG. 1 shows a schematic perspective view of an optoelectronic component 100. The optoelectronic component 100 may e.g. be a light-emitting-diode component. The optoelectronic component 100 comprises an optoelectronic semiconductor chip 200 and a wavelength-converting element 300.

The optoelectronic semiconductor chip 200 may e.g. be a light emitting diode chip (LED chip). The optoelectronic semiconductor chip 200 comprises an upper side 210 which forms a radiation-emitting surface of the optoelectronic semiconductor chip 200. The optoelectronic semiconductor chip 200 emits electromagnetic radiation (such as visible light) at the radiation-emitting surface formed by the upper side 210. The optoelectronic semiconductor chip 200 may e.g. emit electromagnetic radiation of a wavelength in the blue spectral range.

The wavelength-converting element 300 converts the electromagnetic radiation emitted by the optoelectronic semiconductor chip 200 into electromagnetic radiation of a different wavelength. For this purpose, the wavelength-converting element 300 absorbs electromagnetic radiation with the wavelength emitted by the optoelectronic semiconductor chip 200 and subsequently emits electromagnetic radiation of a different, typically larger wavelength. The wavelength-converting element 300 may e.g. convert the electromagnetic radiation emitted by the optoelectronic semiconductor chip 200 into electromagnetic radiation of a wavelength conveying a white color impression in a mixture of parts of the electromagnetic radiation emitted by the optoelectronic semiconductor chip 200 potentially remaining unconverted.

The wavelength-converting element 300 may comprise a phosphor embedded into a matrix. The matrix may comprise an optically essentially transparent material, e.g. silicone. The phosphor may e.g. be an organic or an inorganic phosphor. The phosphor may also comprise quantum dots. The phosphor embedded into the matrix of the wavelength-converting element 300 causes the described wavelength conversion of the wavelength-converting element 300.

Figure 2:
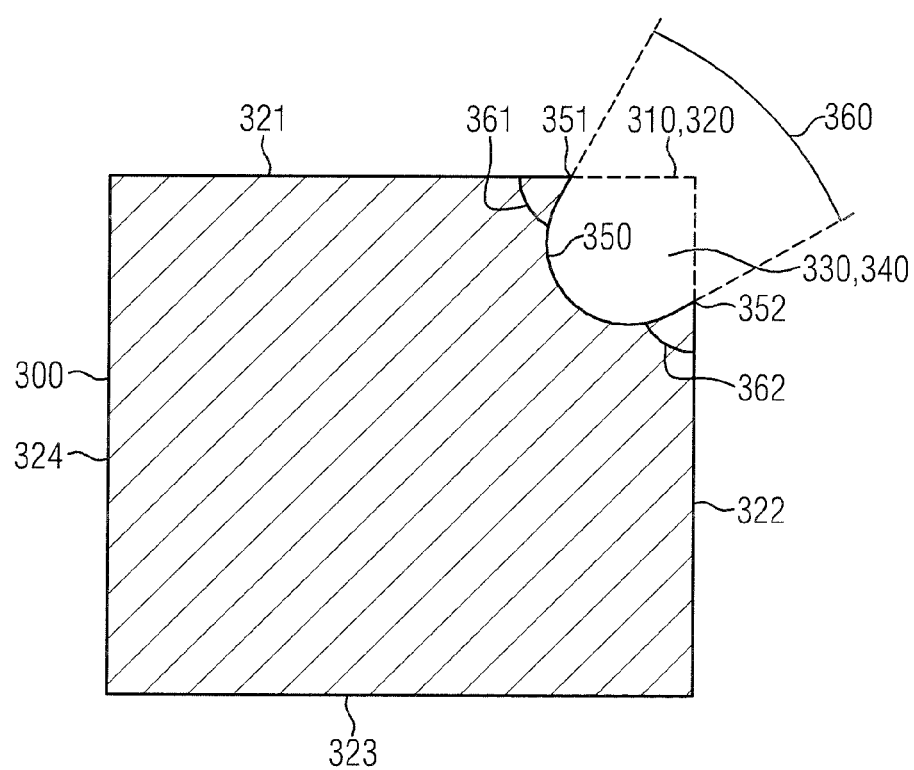
FIG. 2 shows a top view onto the wavelength-converting element.

The upper side 210 of the optoelectronic semiconductor chip 200 has a rectangular shape. The wavelength-converting element 300 is shaped as a flat small plate and arranged on the upper side 210 of the optoelectronic semiconductor chip 200. FIG. 2 shows a schematic top view of the wavelength-converting element 300.

The wavelength-converting element 300 has a basic shape 310 essentially corresponding to the shape of the upper side 210 of the optoelectronic semiconductor chip 200. In the shown example, the wavelength-converting element 300 thus has a rectangular basic shape 310. If the upper side 210 of the optoelectronic semiconductor chip 200 had another but rectangular shape, the wavelength-converting element 300 would correspondingly have to be formed with a different basic shape 310. The rectangular basic shape 310 has an outer contour 320 formed by a first outer edge 321, a second outer edge 322, a third outer edge 323 and a fourth outer edge 324.

A bond pad 220 is arranged in a corner region of the upper side 210 of the optoelectronic semiconductor chip 200. The bond pad 220 may also be referred to as electrical contact pad. The bond pad 220 electrically contacts the optoelectronic semiconductor chip 200 by a bond wire 110. A second electrical contact pad of the optoelectronic semiconductor chip 200 may e.g. be arranged on a bottom side of the optoelectronic semiconductor chip 200 opposite to the upper side 210.

The corner region of the upper side 210 of the optoelectronic semiconductor chip 200 comprising the bond pad 220 must remain uncovered due to the bond wire 110 to be connected thereon and must not be covered by the wavelength-converting element 300. Therefore, the wavelength-converting element 300 comprises a cut-out 340 in a corner region 330 of the basic shape 310. The size of the cut-out 340 is a little larger than the size of the bond pad 220 at the upper side 210 of the optoelectronic semiconductor chip 200.

The cut-out 340 is limited by a boundary edge 350. The boundary edge 350 forms a part of the outer contour of the wavelength-converting element 300. In the region of the boundary edge 350, the outer contour of the wavelength-converting element 300 thus deviates from the outer contour 320 of the rectangular basic shape 310.

The location where the boundary edge 350 meets the first outer edge 321 of the outer contour 320 of the basic shape 310 forms a first intersection 351. The location where the boundary edge 350 meets the second outer edge 320 of the outer contour 320 of the basic shape 310 forms a second intersection 352. The boundary edge 350 extends between the first intersection 351 and the second intersection 352.

At the first intersection 351, a first enclosed angle 361 is enclosed between the boundary edge 350 of the cut-out 340 and the first outer edge 321 of the outer contour 320 of the basic shape 310. At the second intersection 352, a second enclosed angle 362 is enclosed between the boundary edge 350 of the cut-out 340 and the second outer edge 322 of the outer contour 320 of the basic shape 310. The first enclosed angle 361 and the second enclosed angle 362 are each smaller than 90°. Thus, the boundary edge 350 does not depart rectangularly from the outer contour 320 of the basic shape 310 of the wavelength-converting element 300 but from the enclosed acute angles 361, 362.

As a result from the fact that the angles 361, 362 enclosed between the boundary edge 350 of the cut-out 340 and the outer edges 321, 322 of the outer contour 320 of the basic shape 310 are each smaller than 90°, the boundary edge 350 between the first intersection 351 and the second intersection 352 covers an angle of more than 90°. Another result is that between tangents abutting the first intersection 351 and the second intersection 352 at the boundary edge 350, an opening angle 360 smaller than 90° is enclosed.

The described design of the boundary edge 350 of the cut-out 340 of the wavelength-converting element 300 has the advantage that the material of the wavelength-converting element 300 very completely covers the upper side 210 of the optoelectronic semiconductor chip 200 even in the vicinity of the bond pad 220, particularly in regions close to the outer contours of the upper side 210 of the optoelectronic semiconductor chip 200. Thereby, an undesired emission of unconverted electromagnetic radiation of the optoelectronic semiconductor chip 200 at edge regions of the wavelength-converting element 300 is reduced or prevented. Advantageously, the reproducibility of the emission characteristic and the color locus of the optoelectronic component 100 may thus be increased.

The upper side of the wavelength-converting element 300 may exhibit roughness caused by the production process. The outer edges of the upper side of the wavelength-converting element 300 may exhibit roundings caused by the production process.

Figure 3:
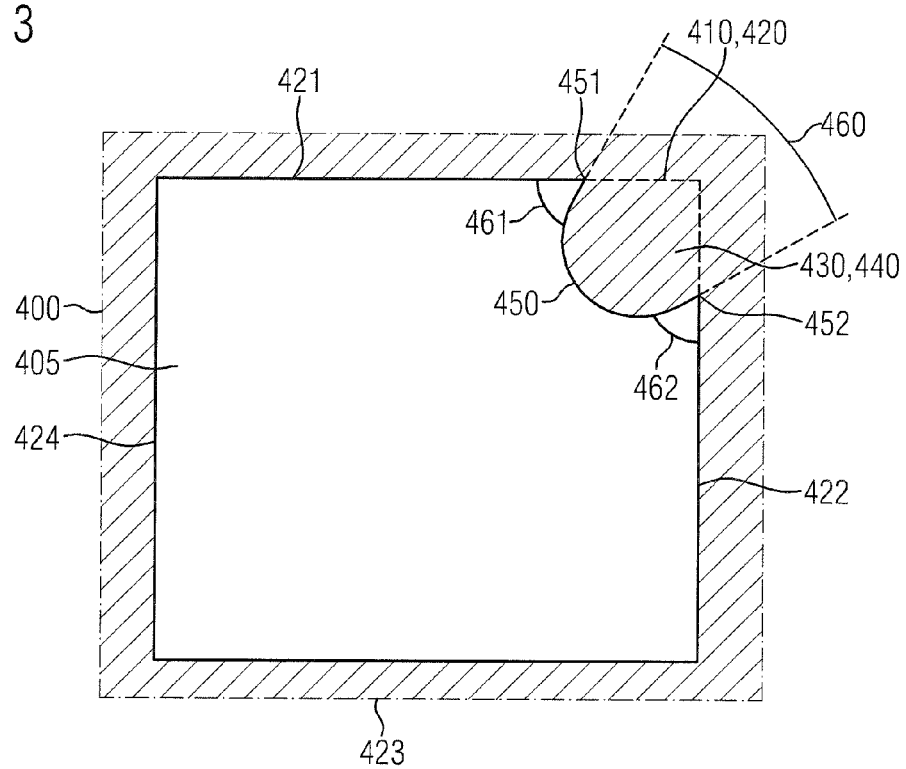
FIG. 3 shows a top view onto a printing stencil for producing a wavelength-converting element.

The wavelength-converting element 300 may be produced by a printing process, e.g. screen-printing or stencil-printing. FIG. 3 shows a schematic view onto a printing stencil 400 which may be used to produce the wavelength-converting element 300 in a printing process.

The printing stencil 400 has a plane configuration and an opening 405. The printing stencil 400 may e.g. be in the form of a screen. In this case, the screen of the printing stencil 400 is open in the region of opening 405 and closed in the other regions of the printing stencil 400.

The shape of the opening 405 essentially corresponds to the shape of the wavelength-converting element 300. In the depicted example, the opening 405 thus has a rectangular basic shape 410 with an outer contour 420 formed by a first outer edge 421, a second outer edge 422, a third outer edge 423 and a fourth outer edge 424.

In a corner region 430 of the basic shape 410, the opening 405 of the printing stencil 400 comprises a cut-out 440. In the region of the cut-out 440 of the opening 405, the printing stencil 400 is thus not open, but tightly closed. The cut-out 440 is defined by a boundary edge 450 forming a part of the outer contour of the opening 405. In the region of the boundary edge 450 of the cut-out 440, the outer contour of the opening 405 thus deviates from the outer contour 420 of the rectangular basic shape 410.

A first intersection 451 forms the location where the boundary edge 450 meets the first outer edge 421 of the outer contour 420 of the basic shape 410. A second intersection 452 forms the location where the boundary edge 450 of the cut-out 440 meets the second outer edge 422 of the outer contour 420 of the basic shape 410. At the first intersection 451, the boundary edge 450 and the first outer edge 421 enclose a first enclosed angle 461. At the second intersection 452, the boundary edge 450 of the cut-out 440 of the opening 405 and the second outer edge 422 of the outer contour 420 of the rectangular basic shape 410 enclose a second enclosed angle 462. The first enclosed angle 461 and the second enclosed angle 462 each amount to less than 90°. As a result, the boundary edge 450 of the cut-out 440 between the first intersection 451 and the second intersection 452 covers an angle of more than 90°. Between tangents abutting the boundary edge 450 of the cut-out 440 at the first intersection 451 and the second intersection 452, an opening angle 460 of less than 90° is enclosed.

Figure 4:
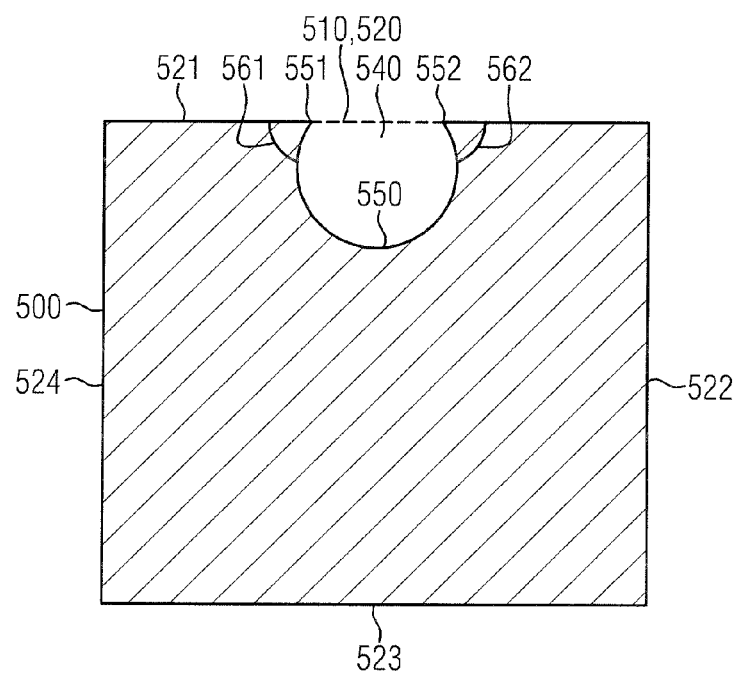
FIG. 4 shows a top view onto a second wavelength-converting element.

FIG. 4 shows a schematic top view onto a further wavelength-converting element 500. The wavelength-converting element 500 is suitable for use in an optoelectronic component comprising an optoelectronic semiconductor chip, the bond pad of which is not arranged in a corner region of a rectangular upper side, but at an outer edge between two corner regions of the upper side.

The wavelength-converting element 500 comprises a rectangular basic shape 510 having an outer contour 520. The outer contour 520 of the rectangular basic shape 510 is formed by a first outer edge 521, a second outer edge 522, a third outer edge 523 and a fourth outer edge 524. Each outer edge 521, 522, 523, 524 rectangularly adjoins the two respectively adjacent outer edges 521, 522, 523, 524.

The wavelength-converting element 500 comprises a cut-out 540 at the first outer edge 521 of its basic shape 510. In the region of the cut-out 540, the shape of the wavelength-converting element 500 deviates from the basic shape 510. The cut-out 540 is defined by a boundary edge 550. The boundary edge 550 forms a part of the outer contour of the wavelength-converting element 500. In the region of the boundary edge 550 the outer contour of the wavelength-converting element 500 thus deviates from the outer contour 520 of the basic shape 510.

In a first intersection 551 and in a second intersection 552, the boundary edge 550 meets the outer edge 521 of the outer contour 520 of the imaginary rectangular basic shape 510. At the first intersection 551, the boundary edge 550 encloses a first enclosed angle 561 with the first outer edge 521. At the second intersection 552, the boundary edge 550 of the cut-out 540 encloses a second enclosed angle 562 with the first outer edge 521 of the outer contour 520 of the basic shape 510. The first enclosed angle 561 and the second enclosed angle 562 each amount to less than 90°. As a result, the boundary edge 550 of the cut-out 540 covers an angle of more than 180° between the first intersection 551 and the second intersection 552. Between the tangents abutting the boundary edge 550 at the first intersection 551 and the second intersection 552, a non-negligible angle is enclosed. Thus, the tangents are not oriented in parallel with regard to each other.

The wavelength-converting element 500 of FIG. 4 may be produced by a printing process using a printing stencil, the printing stencil comprising an opening the shape of which is complementary to the described shape of the wavelength-converting element 500.

Wavelength-converting elements having an other than rectangular basic shape are also possible. For example, wavelength-converting elements having a round basic shape are conceivable. In each case, the basic shape of the wavelength-converting element preferably corresponds to the shape of an optoelectronic semiconductor chip on which the wavelength-converting element is to be arranged. In each case, the wavelength-converting element comprises a cut-out compared to its basic shape, the cut-out being defined by a boundary edge. In each case, the boundary edge meets the outer contour of the respective basic shape of the wavelength-converting element in an acute angle.

Our elements, components and stencils are shown and described in more detail in conjunction with preferred examples. However, this disclosure is not limited to the disclosed examples. Rather, those skilled in the art may derive variations therefrom without departing from the protective scope of the appended claims.

The invention claimed is:

1. A wavelength-converting element having a shape of a small flat plate having a basic shape with an outer contour, wherein the wavelength-converting element comprises a cut-out compared to the basic shape which is defined by a boundary edge, and the boundary edge meets the outer contour of the basic shape of the wavelength-converting element in an acute angle.

2. The wavelength-converting element according to claim 1, wherein the wavelength-converting element has a rectangular basic shape.

3. The wavelength-converting element according to claim 1, wherein the cut-out is arranged in a corner region of the basic shape of the wavelength-converting element.

4. The wavelength-converting element according to claim 1, wherein the wavelength-converting element comprises silicone.

5. The wavelength-converting element according to claim 1, wherein the wavelength-converting element comprises an embedded phosphor.

6. An optoelectronic component comprising an optoelectronic semiconductor chip, wherein a wavelength-converting element according to claim 1 is arranged on an upper side of the optoelectronic semiconductor chip.

7. The optoelectronic component of claim 6, wherein the optoelectronic semiconductor chip is a light emitting diode chip.

8. The optoelectronic component of claim 6 further comprising:
a bond pad formed on the upper side of the optoelectronic semiconductor chip,
wherein the cut-out of the wavelength-converting element is arranged above the bond pad.

9. A printing stencil for manufacturing a wavelength-converting element, comprising an opening having a basic shape with an outer contour,
wherein the opening comprises a cut-out compared to the basic shape which is defined by a boundary edge, and
the boundary edge meets the outer contour of the basic shape of the wavelength-converting element in an acute angle.

10. A screen comprising the printing stencil of claim 9.

11. An optoelectronic component comprising an optoelectronic semiconductor chip, wherein a wavelength-converting element according to claim 2 is arranged on an upper side of the optoelectronic semiconductor chip.

12. An optoelectronic component comprising an optoelectronic semiconductor chip, wherein a wavelength-converting element according to claim 3 is arranged on an upper side of the optoelectronic semiconductor chip.

13. An optoelectronic component comprising an optoelectronic semiconductor chip, wherein a wavelength-converting element according to claim 4 is arranged on an upper side of the optoelectronic semiconductor chip.

14. An optoelectronic component comprising an optoelectronic semiconductor chip, wherein a wavelength-converting element according to claim 5 is arranged on an upper side of the optoelectronic semiconductor chip.

15. The optoelectronic component of claim 7 further comprising:
a bond pad formed on the upper side of the optoelectronic semiconductor chip,
wherein the cut-out of the wavelength-converting element is arranged above the bond pad.

\* \* \* \* \*